United States Patent [19]

Theriault

[11] 4,408,348

[45] Oct. 4, 1983

[54] MULTIBAND TUNING SYSTEM FOR A TELEVISION RECEIVER

[75] Inventor: Gerald E. Theriault, Hopewell, N.J.

[73] Assignee: RCA Corporation, New York, N.Y.

[21] Appl. No.: 294,133

[22] Filed: Aug. 19, 1981

[51] Int. Cl.³ .............................................. H04B 1/26
[52] U.S. Cl. .................................... 455/180; 455/188; 455/190; 455/315
[58] Field of Search ................ 455/168, 180, 188–190, 455/314, 315; 334/15

[56] References Cited

U.S. PATENT DOCUMENTS

| | | |
|---|---|---|
| 3,942,122 | 3/1976 | Nakanishi . |
| 3,961,264 | 6/1976 | Hekimian et al. . |
| 3,976,943 | 8/1976 | Cipher et al. . |
| 4,002,986 | 1/1977 | Ma . |
| 4,132,952 | 1/1979 | Hongu et al. . |
| 4,160,213 | 7/1979 | Carter ................................. 455/180 |
| 4,162,452 | 7/1979 | Ash . |
| 4,189,678 | 2/1980 | Sakamoto et al. ................... 455/180 |
| 4,247,953 | 1/1981 | Shinagawa et al. ................. 455/191 |
| 4,271,529 | 6/1981 | Strammello, Jr. ................... 455/180 |
| 4,322,856 | 3/1982 | Ohta et al. .......................... 455/189 |
| 4,368,540 | 1/1983 | Carlson et al. ...................... 455/180 |

FOREIGN PATENT DOCUMENTS

| | | |
|---|---|---|
| 2746931 | 4/1978 | Fed. Rep. of Germany ...... 455/189 |
| 55-26731 | 2/1980 | Japan . |
| 1584738 | 2/1981 | United Kingdom . |

OTHER PUBLICATIONS

D. L. Ash, "High Performance [TV] Receiver", *IEEE Trans. on Consumer Electronics*, vol. CE-24, No. 1, Feb. 1978, pp. 39–46.

W. R. Shreve et al., "Surface Acoustic Wave Devices for Use in a High Performance Television Tuner", *IEEE Trans. on Consumer Electronics*, vol. CE-24, No. 1, Feb. 1978, pp. 96–104.

V. N. Lietaert, "Fernsehempfanger mit Kontinuierlich Einstellbarem Kanalwahler von 40 bis 300 MHz." *Rundfunktechn. Mitteilungen*, 1975, pp. 267–269 (translation enclosed).

*Primary Examiner*—Jin F. Ng
*Attorney, Agent, or Firm*—E. M. Whitacre; P. J. Rasmussen; C. A. Berard, Jr.

[57] ABSTRACT

A multiband tuning system produces an IF signal from RF signals residing in, in the order named, a first broadcast band, a first cable band, a second broadcast band and a second cable band. A control device generates a tuning signal having a magnitude determined by the frequency of a selected channel. A first filter selects RF signals corresponding to channels selected in a first tuning band including the first broadcast band and a lower frequency portion of the first cable band in response to the tuning signal. A second filter selects RF signals corresponding to channels selected in a second tuning band including an upper frequency portion of the first cable band, the second broadcast and the second cable bands in response to the tuning signal. A selection device enables operation of the first filter when the selected channel is within the first tuning band and enables operation of the second filter when the selected channel is in the second tuning band.

18 Claims, 8 Drawing Figures

MULTIBAND TUNING SYSTEM FOR A TELEVISION RECEIVER

This invention relates to tuning systems for television receivers for selecting one of a plurality of channels disposed in a plurality of frequency bands.

The tuning systems in commercially available television (TV) receivers commonly employ a plurality of tuners, each including its own mixer, for receiving signals in a plurality of TV frequency bands. For example, a first tuner selects channels in the VHF-TV frequency bands (54-88 megaHertz (MHz) and 174-216 MHz) while a second tuner selects channels in the UHF-TV frequency bands (470-890 MHz). When it is desired for the TV receiver to also accept cable television (CATV) signals, its tuning system may require the addition of a third tuner and mixer.

Double conversion tuning systems to avoid the complexity and expense inherent in a plurality of tuners have been disclosed for receiving broadcast (off-the-air) VHF-TV and UHF-TV signals such as that described by D. L. Ash, "High Performance TV Receiver", *IEEE Transactions on Consumer Electronics*, Volume CE-24, No. 1, February 1978, Pages 39-46. The need still exists, however, for a simple and low-cost tuning system for receiving VHF-TV, UHF-TV and CATV signals.

In the present invention, a multiband tuning system produces an IF signal from RF signals residing in, in the order named, a first broadcast band, a first cable band, a second broadcast band and a second cable band. A control device generates a tuning signal having a magnitude determined by the frequency of a selected channel. A first filter selects RF signals corresponding to channels selected in a first tuning band including the first broadcast band and a lower frequency portion of the first cable band in response to the tuning signal. A second filter selects RF signals corresponding to channels selected in a second tuning band including an upper frequency portion of the first cable band, the second broadcast and the second cable bands in response to the tuning signal. A selection device enables operation of the first filter when the selected channel is within the first tuning band and enables operation of the second filter when the selected channel is in the second tuning band.

In the double conversion tuning system of FIG. 1, television signals received at UHF antenna input 10, at VHF antenna input 30A and at CATV input 30B are coupled to diplexer 20 as will be described below. That system is a double conversion tuning system because two frequency conversions (shifts) are performed. In the United States, those television signals comprise the channel numbers and reside in the frequency bands indicated in the following table.

TABLE 1

| TV Band | Frequency Range (megaHertz) | Channel Number |
| --- | --- | --- |
| Low VHF Broadcast (L-VHF) | 54-88 | 2-6 |
| Midband Cable (MB-CATV) | 90-174 | A-5 to I |
| High VHF Broadcast (H-VHF) | 174-216 | 7-13 |
| Superband Cable (SB-CATV) | 216-402 | J to W + 17 |
| UHF Broadcast (UHF) | 470-890 | 14-83 |

Each channel is alotted about 6 MHz of bandwidth in the frequency spectrum and has a picture carrier at a frequency 1.25 MHz higher than the frequency at the lower limit of its assigned channel bandwidth. Where specific channel frequencies are referred to in the following descriptions, that frequency will correspond to the frequency to which the picture carrier of the selected television channel is translated in the particular portion of the tuning system being described.

Figure 2:
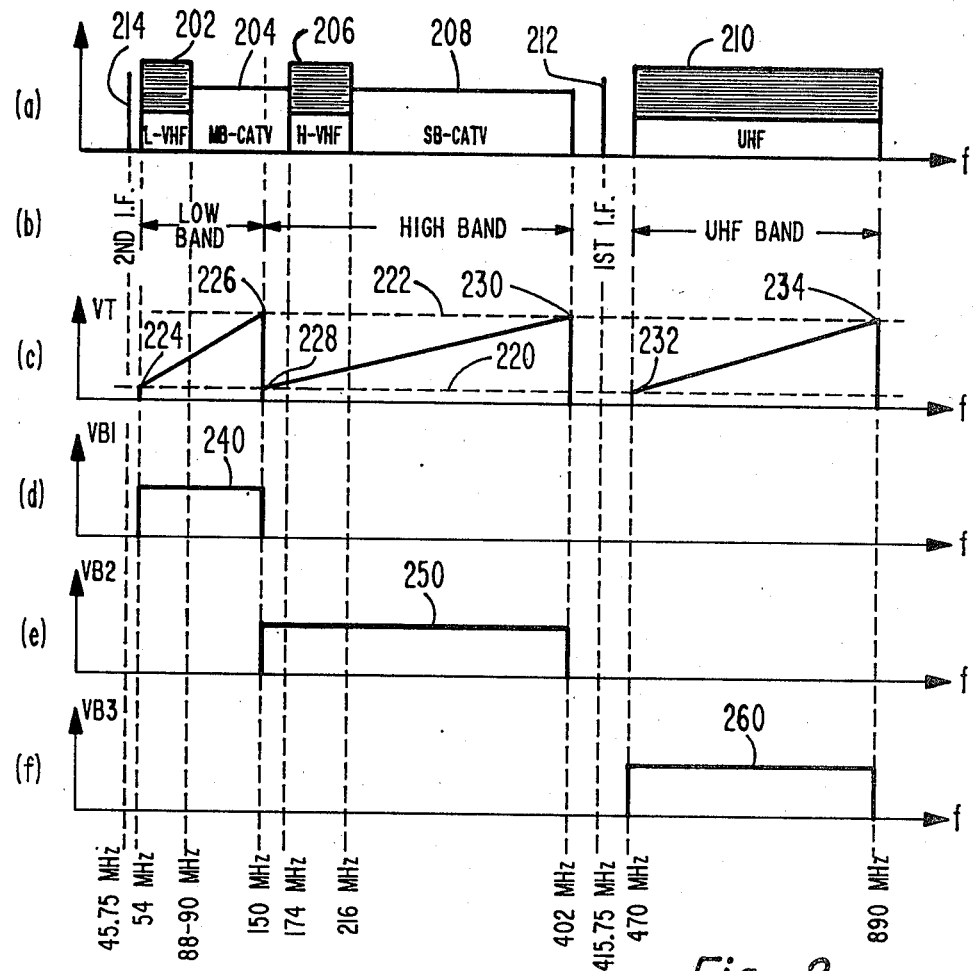
FIGS. 2, 3, 5 and 6 are graphical representations of various amplitude versus frequency response characteristics associated with the embodiment of FIG. 1.

The frequency spectrum for channel frequencies "f" in the various TV frequency bands in the United States is shown in FIG. 2(a). For the L-VHF band 202, H-VHF band 206, and UHF band 210, the amplitude of received signals is shown as a plurality of levels indicating that broadcast signals can vary in strength over a wide range, for example, between 10 microvolts and 100 millivolts. Received CATV signals, on the other hand, exhibit a much smaller variation in signal strength, typically between 1 and 6 millivolts, as illustrated for the MB-CATV band 204 and the SB-CATV band 208.

FIG. 2(b) defines the low-band, high-band and UHF-band of radio frequencies (RF) associated with filters 44, 36 and 14, respectively, of FIG. 1 to be described below. The first intermediate frequency (IF) is selected to be at 415.75 MHz, which is between the SB-CATV and the UHF-TV bands. It is also without the radar band of about 420-450 MHz and so is unlikely to interfere with, or be interfered with by, other signal sources. The second IF is at the standard TV IF frequency of 45.75 MHz.

It is understood that while the present invention is described in terms of the various broadcast and cable bands presently used in the United States, the invention is not limited to that arrangement. For example, broadcast band signals could in fact be supplied via a cable.

Figure 1:
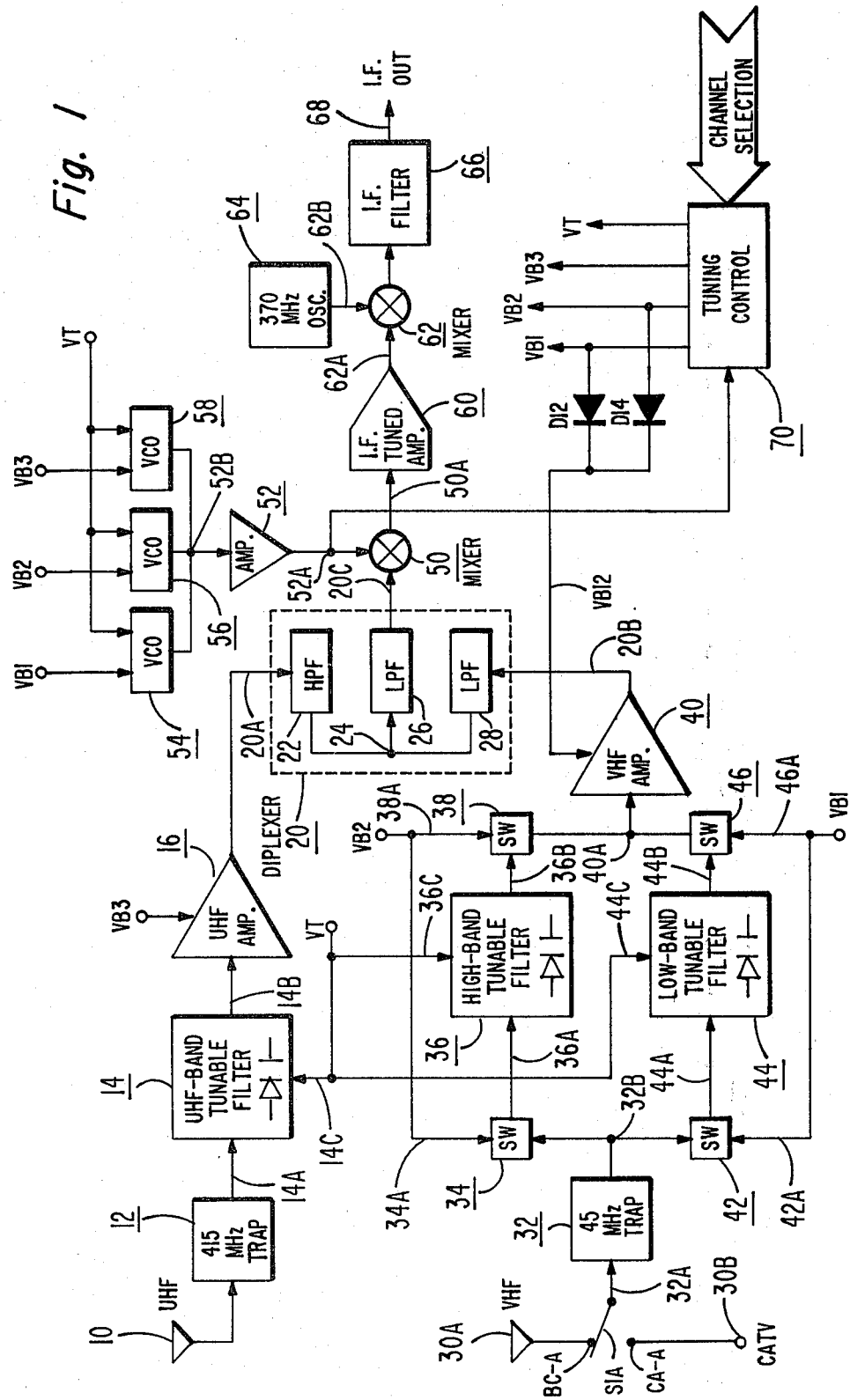
FIG. 1 is a schematic diagram in block diagram form of a tuning system including an embodiment of the present invention.

When the TV channel selected is within the UHF band, it is coupled from UHF antenna 10 to a diplexer input 20A via UHF-band frequency selective tunable filter 14 of FIG. 1. Filter 14 receives tuning potential VT at connection 14C so that it preferentially passes the frequencies corresponding to the selected TV channel between its input 14A and its output 14B.

Figure 3:
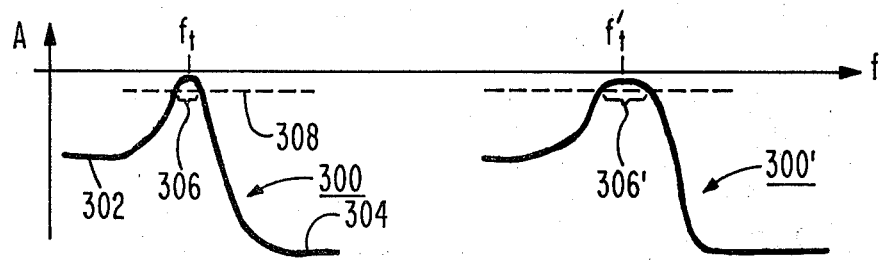

FIG. 3 shows frequency selective attenuation characteristic 300 corresponding to the selection of TV channels at relatively lower UHF frequency $f_t$. Filter 14 exhibits a generally low-pass characteristic characterized by lesser attenuation at lower frequency portion 302 of curve 300 and relatively greater attenuation at higher frequency portion 304. Filter 14 preferentially passes signals at about the selected channel frequency $f_t$ as indicated by the peak near that frequency of bandwidth 306. Bandwidth is defined between the intersections of characteristics 300 with phantom lines 308 indicating 3 dB greater attenuation than in the passband. Characteristic 300' corresponds to characteristic 300 when the selected channel frequency $f_t$ is at relatively higher frequency $f'_t$. For filter 14, bandwidth 306 is about 25 MHz when frequency $f_t$ corresponds to UHF channel 14, while bandwidth 306' increases somewhat to about 40 MHz when frequency $f'_t$ corresponds to UHF channel 83, for the circuit described below with respect to FIG. 4. A specific embodiment of filter 14 is described below.

Figure 5:
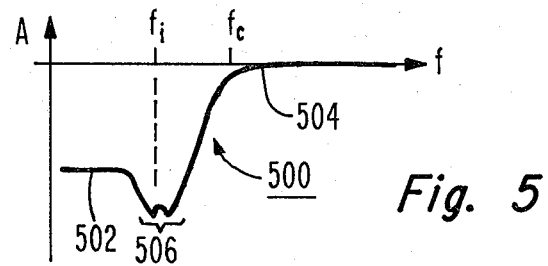

Trap 12 reduces the level of any 416 MHz signals received by UHF antenna 10 since the 416 MHz first IF frequency is near the UHF band. Those undesirable signals could either be externally developed or be leaked from the first IF section. Trap 12 tends to reduce unwanted signals at the first IF frequency from being applied to the IF circuits. Trap 12 exhibits high-pass frequency characteristic 500 shown in FIG. 5 in that it exhibits little attenuation in its portion 504 at frequencies greater than $f_c$ which corresponds to the lowest frequency in the UHF band (about 470 MHz) and greater attenuation in portion 502 at lower frequencies. Around the IF frequency $f_i$ (416 MHz), trap 12 exhibits greatest attenuation as indicated by portion 506 of characteristic 500.

UHF amplifier 16 couples signals between output 14B of filter 14 and input 20A of diplexer 20, exhibits 14-15 dB of gain over the UHF frequency range and has input and output impedances of about 50 ohms. Amplifier 16 is operative only when a channel in the UHF band has been selected because its operating voltage, bandswitch voltage VB3 (about 18 volts), is present only when channels in the UHF frequency band have been selected, as indicated by level 260 of FIG. 2(f).

TV signals in the VHF and CATV bands are partitioned into low and high tuning bands as follows. Those signals span a range of frequencies in excess of seven-to-one; tuning over a range greater than three-to-one is impractical owing to the limited range of voltage-variable capacitance diodes. Partitioning that 54-402 MHz range between the MB-CATV and H-VHF bands (at about 174 MHz) would still require a tuning range of about $3\frac{1}{4}$-to-one for the low-band. The present apparatus partitions the tuning bands at a frequency within the MB-CATV band at about 150 MHz, as shown in FIG. 2(b). Thus, each of the high and low tuning bands includes signals having less than a three-to-one range of frequencies.

The selection of low and high tuning band frequencies is also influenced by design considerations for filters 36 and 44. In filter design, it is more difficult to achieve a given narrow bandwidth at higher frequencies than at lower frequencies; it is also more difficult to obtain constant bandwidth in a filter tunable over a wide range of frequencies. To minimize distortion and adjacent channel interference, a narrower filter bandwidth is necessary where the channel signal amplitudes vary widely (as for VHF-TV broadcast signals) than where there is a lesser amplitude range (as for CATV signals). Because the boundary between low- and high-band has been established at 150 MHz within the MB-CATV band, the widely varying L-VHF and H-VHF broadcast TV signals are both at the low frequency ends of the tuning system bands and the more controlled MB-CATV and SB-CATV signals are at the high ends of those bands. Thus, the frequency partitioning of the filters employed in the present tuning system desirably provides satisfactory performance while easing the difficulty of the design requirements for the tunable filters employed therein.

TV signals in the VHF and CATV frequency bands are coupled to diplexer 20 as follows. In FIG. 1, switch S1A can be switched to position BC-A to apply signals from VHF antenna 30A to input 32A of trap 32 or can be connected to position CA-A to apply CATV signals from input terminal 30B thereto. Trap 32 is similar to trap 12 described above with respect to FIG. 5 except that its maximum attenuation range 502 is at the second IF frequency $f_i$ (about 46 MHz) which is near frequency $f_c$ (about 54 MHz) corresponding to the lowest frequency to be received (VHF channel 2). Trap 32 couples signals in both the low (54 to 150 MHz) and high (150 to 402 MHz) bands to node 32B. If the selected channel is in the high-band, then VB2 is applied to render switches 34 and 38 conductive (closed) to thereby couple high-band filter 36 between nodes 32B and 40A. If the selected channel is in the low-band, however, then VB1 is applied to switches 42 and 46 which are then rendered conductive to connect low-band filter 44 between nodes 32B and 40A.

Figure 6:
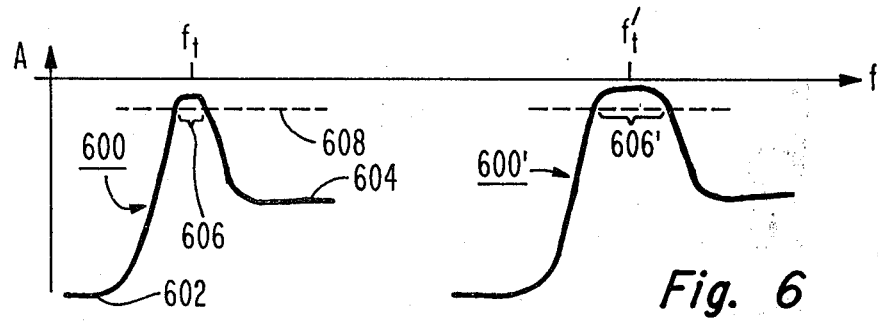

High-band tunable filter 36 exhibits the high-pass frequency selective characteristic 600 shown in FIG. 6 in that greater attenuation occurs in relatively lower frequency portion 602 than in relatively higher frequency portion 604. As a result, filter 36 not only selects frequencies corresponding to the selected channel $f_t$ but also tends to reject signals at lower frequencies, particularly those in the low tuning band range of frequencies. Bandwidth is indicated for curve 600 with respect to $-3$ dB line 608. As higher frequency channels are selected, the bandwidth of filter 36 increases. Characteristic 600' corresponds to characteristic 600 when selected channel frequency $f_t$ is at relatively higher frequency $f'_t$. When filter 36 is tuned so that $f_t$ corresponds to MB-CATV channel F, bandwidth 606 is about 18 MHz; when $f'_t$ corresponds to SB-CATV channel W+17, bandwidth 606' is about 40 MHz.

Low-band tunable filter 44 exhibits low-pass frequency selective characteristic 300 shown in FIG. 3 and described above in relation to UHF filter 14 except that its bandwidth is allowed to increase to a substantially greater degree as higher frequency channels are selected. Bandwidth 306 is about 8 MHz when $f_t$ corresponds to VHF channel 2, and bandwidth 306' is about 20 MHz when $f'_t$ corresponds to MB-CATV channel E. Filter 44 thus not only selects frequencies corresponding to the selected channel $f_t$ but also tends to reject signals at higher frequencies, particularly those in the high tuning band and at the first IF frequency.

VHF amplifier 40 in FIG. 1 couples signals from node 40A to input 20B of diplexer 20 and is substantially the same as UHF amplifier 16 described above. It differs, however, in that its operating potential VB12 is applied via a diode "OR" circuit comprising diodes D12 and D14 so that amplifier 40 receives as operating potential bandswitch voltage VB1 or VB2 whenever a channel within the low or high tuning bands is selected, but does not receive operating potential when a channel in the UHF band is selected. Node 40A can thus be disconnected from diplexer input 20B when a UHF channel is selected.

Diplexer 20 of FIG. 1 receives RF signals from the UHF band signal path, at its input connection 20A, receives RF signals from the VHF and CATV band signal paths at its input 20B, and combines those signal paths to pass RF signals to its output connection 20C. Within diplexer 20, the circuit path comprises high-pass filter 22 coupling input 20A to a circuit point 24 followed by low-pass filter 26 coupling that circuit point to output 20C. Input 20B is connected to circuit point 24 by a plurality of low-pass filters 28 connected in cascade.

Mixer 50 receives RF signals from diplexer output 20C and local oscillator frequency signals from amplifier 52 via point 52A. In response, mixer 50 translates RF signal at the selected channel frequency to a signal at the first IF of about 416 MHz (i.e., the first frequency conversion). U.S. patent application Ser. No. 294,131 entitled, DIPLEXER FOR TELEVISION TUNING SYSTEMS, filed by G. E. Theriault on even date herewith, which is assigned to the same assignee as is the present invention, is incorporated herein by reference for the purpose of describing suitable implementations of diplexer 20 and mixer 50.

Amplifier 52 provides a relatively higher level frequency signal in a range of 10–18 dBm to frequency mixer 50 and maintains an impedance of about 50 ohms at point 52A. When mixer 50 is driven by such higher level of frequency signal, RF signal from diplexer 20 can also be of greater relative strength without introducing additional distortion.

It is preferred to select a relatively high IF frequency of about 416 MHz, a high drive level to mixer 50, for the reasons described above. It is also preferred to minimize the distortion in mixer 50 by selecting the gain of the circuits between antennas 10 and 30A and mixer 50 to be just sufficient to obtain an acceptable noise figure in the receiver. In that case, the respective bandwidths of filters 14, 36 and 44 can be relatively greater for the double conversion tuning system as compared to the narrower bandwidths which would be required in a single conversion tuning system, to obtain equivalent distortion and noise performance. That advantage permits filter bandwidth to be allowed to increase along with the frequency of the selected channel, as described above.

This first IF signal is then amplified by IF amplifier 60. Amplifier 60 can include a two-section input filter tuned to the 416 MHz IF frequency with about 12 MHz bandwidth, and a three-section output filter also tuned to the 416 MHz IF frequency with about 10 MHz bandwidth. The amplified IF signal at IF amplifier output 62A is then frequency mixed with a 370 MHz frequency signal from local oscillator 64 by frequency mixer 62 in a second frequency conversion to produce the conventional IF signal at 46 MHz. The second IF signal is then coupled to IF output 68 via IF filter 66.

Tuning control 70 responds to a channel selection to develop tuning potential VT and bandswitch potentials VB1, VB2 and VB3. Tuning potential VT, shown in FIG. 2(c), typically varies between a low level of about 1.5 volts, indicated by phantom line 220, and a higher level of about 24 volts, indicated by phantom line 222. When the selected channel is in the low tuning band, VT tends toward a low value at point 224 when VHF channel 2 is selected and tends toward a high value at point 226 when MB-CATV channel E is selected. When the selected channel is in the high tuning band, VT also tends toward a low value at point 228 when MB-CATV channel F is selected and tends toward a high value at point 230 when SB-CATV channel W+17 is selected. Similarly, VT tends toward a low value at point 232 when UHF channel 14 is selected and toward a high value at point 234 when UHF channel 83 is selected. Bandswitch signals VB1, VB2 and VB3 are at a high level of about 18 volts as indicated by characteristics 240, 250 and 260 of FIGS. 2(d), 2(e) and 2(f) only when a channel in the band to which they correspond has been selected, and are at zero volts when a channel outside that particular band is selected. U.S. patent application Ser. No. 271,742, entitled, A PHASE-LOCKED LOOP TUNING SYSTEM INCLUDING A PRESCALER CONDITIONED TO OSCILLATE AT AN OUT-OF-BAND FREQUENCY, filed by D. J. Carlson et al, now U.S. Pat. No. 4,368,540, which is assigned to the same assignee as is the present invention and incorporated herein by reference for the purpose of describing a tuning control suitable for developing tuning and bandswitch potentials of the sort developed by control 70.

Three tunable voltage controlled local oscillators (VCO) 54, 56 and 58 are provided to develop the local oscillator frequency signals in the three tuning bands. That is done so that the frequency of a particular oscillator (54, 56, 58) can be conveniently made to track the frequency tuning of its associated filter (14, 36, 44, respectively), responsive to the same tuning potential VT. The range of frequencies at which frequency signals must be supplied to amplifier 52 at point 52B can be seen from the following table.

TABLE 2

| Band | Channel Number | Local Oscillator Frequency (megaHertz) |
|---|---|---|
| Low Band (VCO 58) | 2(L-VHF) | 471 |
| | 6(L-VHF) | 499 |
| | A-5(MB-CATV) | 507 |
| | E(MB-CATV) | 561 |
| High Band (VCO 56) | F(MB-CATV) | 567 |
| | I(MB-CATV) | 585 |
| | 7(H-VHF) | 591 |
| | 13(L-VHF) | 627 |
| | J(SB-CATV) | 633 |
| | W + 17(SB-CATV) | 813 |
| UHF Band (VCO 54) | 14(UHF) | 887 |
| | 83(UHF) | 1301 |

Oscillators 54, 56 and 58 respectively receive bandswitch potentials VB1, VB2 and VB3 as their operating potential, so to be operative only when the channel selected falls within the frequency band with which the particular oscillator is associated.

Suitable implementations for filters 14, 36 and 44, shown in FIGS. 4 and 7, will now be described.

Figure 4:
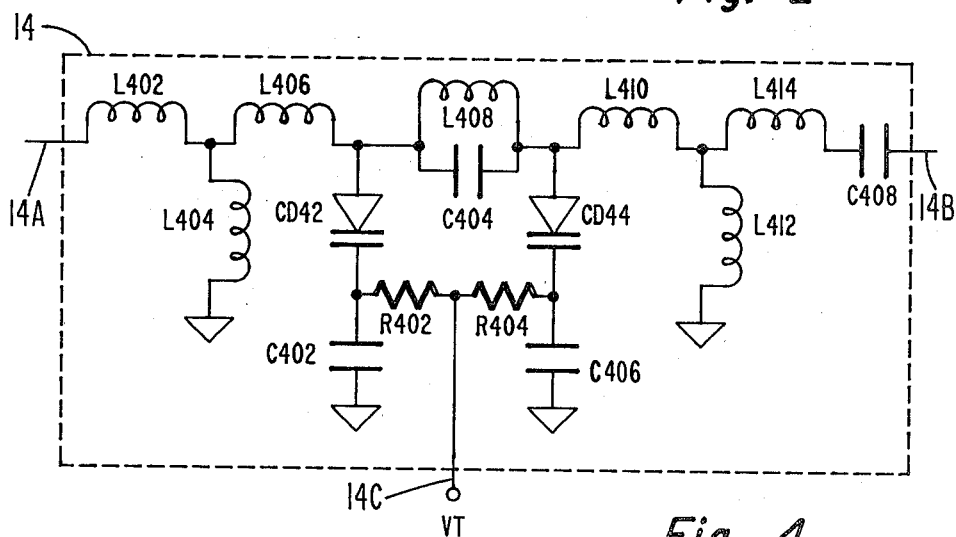
FIGS. 4, 7 and 8 are schematic diagrams of circuits useful in the tuning system of FIG. 1.

UHF-band filter 14, shown in FIG. 4, is a double-tuned, low-pass filter with "high-side inductive coupling" provided between its input 14A and its output 14B by the serial connection of inductors L402, L406, L408, L410 and L414. C408 serves as a DC blocking capacitor with negligible AC impedance at UHF frequencies. Inductors L404 and L406 serve as a tapped inductor configuration for maintaining the impedance at input 14A at about 50 ohms. Similarly, inductors L410 and L412 serve as a tapped inductor configuration for maintaining the impedance at output 14B at about 50 ohms. Input and output inductors L402 and L414 aid in maintaining a substantially constant bandwidth over the broad tuning range of filter 14. Capacitor C404 is connected in parallel with inductor L408 to resonate at about 1,000 MHz. Variable frequency tuning is provided by variable capacitance diodes CD42 and CD44, respectively connected from the ends of the L408-C404 tuned circuit to ground via coupling capacitors C402 and C406 which exhibit a very low impedance at the frequencies of television signals passed by filter 14. Tuning potential VT at terminal 14C is applied to vary the capacitance of diodes CD42 and CD44 via isolation resistors R402 and R404, respectively. VT can vary between about 1.5 and 24 volts for UHF channels 14–83.

Figure 7:
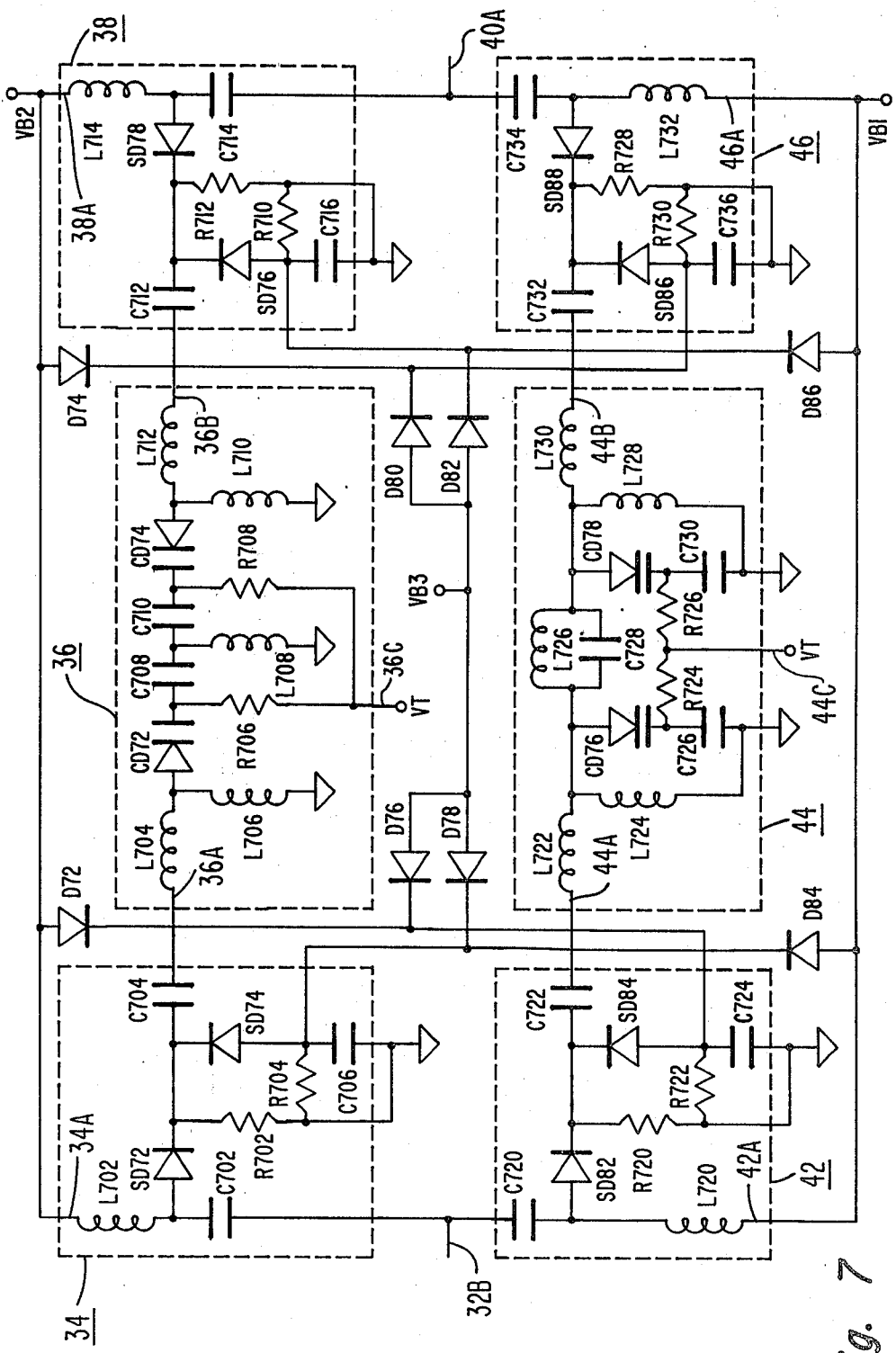

FIG. 7 is a detailed diagram of switches 34, 38, 42 and 44 and of tunable filters 36 and 44. Switch 34 conducts TV signals from node 32B to input 36A via DC blocking capacitors C702 and C704 when PIN diode SD72 is rendered conductive by the application of bandswitch voltage VB2 through RF choke L702. Resistor R702 controls the forward current flowing through SD72 when a channel in the high-band is selected. During that time, PIN diode SD74 is held reverse-biased by the potential across resistor R702. When the channel selected is in a band other than the high-band, diode SD74 is forward-biased by either VB1 applied through diode D84 or by VB3 applied through diode D78. The forward current flowing in SD74 is determined by resistor R702, and the potential thereacross applies reverse-bias to SD72. Resistor R704 provides a return path when SD74 is reverse-biased. Capacitor C706 is a DC blocking capacitor providing a low impedance connection at TV frequencies between the cathode of SD72 and ground when SD74 is conductive.

Switch 38 is of the same type as is switch 34, and they are rendered conductive and nonconductive together. Switches 42 and 46 are also of like sort to that of switch 34, however, they are rendered conductive only when the selected channel is in the low-band. Corresponding elements, which perform similar functions in switches 34, 38, 42 and 46, are listed on the same line of the following table.

TABLE 3

| Switch 34 | Switch 38 | Switch 42 | Switch 46 |
|---|---|---|---|
| L702 | L714 | L720 | L732 |
| C702 | C714 | C720 | C734 |
| C704 | C712 | C722 | C732 |
| C706 | C716 | C724 | C736 |
| R702 | R712 | R720 | R728 |
| R704 | R710 | R722 | R730 |
| SD72 | SD78 | SD82 | SD88 |
| SD74 | SD76 | SD84 | SD86 |
| D78 | D82 | D76 | D80 |
| D84 | D86 | D72 | D74 |

High-band tunable filter 36 exhibits a high-pass characteristic owing to the series connection of capacitances C708, C710 and capacitance diodes CD72 and CD74 between input 36A and output 36B and the "low-side" inductive coupling of shunt inductances L706, L708 and L710. The section including capacitors C708, C710 and L708 exhibits a high-pass characteristic tuned to reject signals in the low-band. Variable tuning is provided by varying the respective capacitances of variable capacitance diodes CD72 and CD74 responsive to reverse-bias applied respectively via resistors R706 and R708 from tuning potential VT at terminal 36C. The capacitance of CD72 resonates with inductors L704 and L706, while that of CD74 resonates with L710 and L712.

Low-band tunable filter 44 is "high-side inductively coupled" and is similar to UHF filter 14 described above. Inductor L726 and capacitor C728 are tuned to resonate at about 200 MHz, thereby to block signals in the high-band. That frequency is further tuned to lower values by the application of tuning potential VT from terminal 44C to voltage variable capacitance diodes CD76 and CD78 via resistors R724 and R726. Capacitors C726 and C730 provide relatively low impedance paths at TV frequencies between the respective cathodes of CD76 and CD78 and ground. Inductors L722 and L724 serve as a tapped inductance configuration as do inductors L730 and L728.

Modifications to the present invention are contemplated, and the present invention should be limited only by the claims following. For example, switch S1 has been shown as a mechanical switch, because it is presumed that a television receiver would normally be used with either a VHF antenna 30A or with a CATV connection 30B but not both because VHF channel programming is usually provided by the CATV source as well. However, if full automatic reception were desired, S1A could be replaced with a relay or a PIN diode switch controlled by a bandswitch voltage or by a diplexer.

Furthermore, UHF amplifier 16 and VHF amplifier 40 could be removed, and PIN diode switches of similar sort to switch 34 put in their places if a single amplifier is inserted in connection 20C between diplexer 20 and mixer 50.

Figure 8:
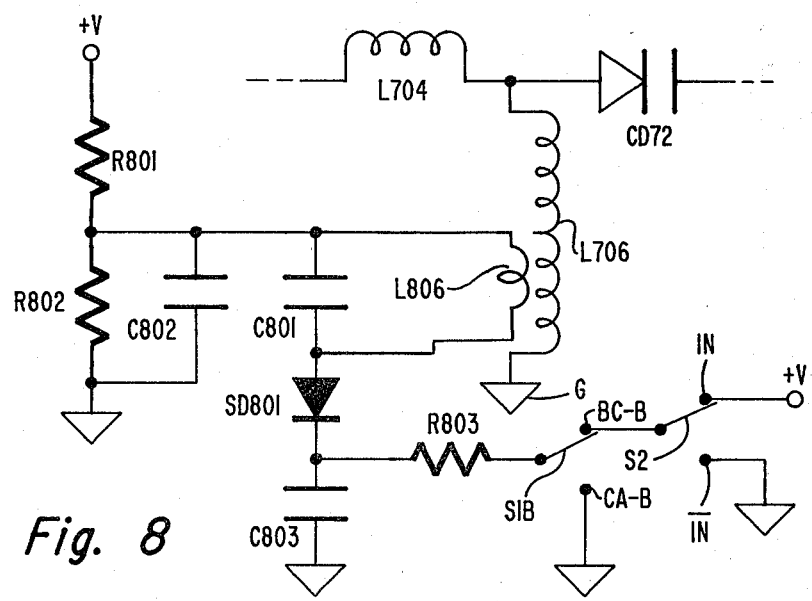

A specific modification, desirable when the first IF frequency is about 416 MHz, is shown in FIG. 8. Broadcast TV signals for VHF channel 12 have a picture carrier at about 205 MHz and a sound carrier at about 210 MHz. Because the second harmonics of those carriers, as well as signals at the sum of their frequencies, are close to the IF frequency, it is desirable to provide attenuation of those carriers. To that end, L706, described above in relation to FIG. 7, is selectively coupled to form a trap except at times when channel 12, or adjacent channels 11 and 13, are selected.

Inductance L806 is located so that its coil mutually couples with the two turns of the coil of L706 nearest to ground G. As a result, capacitance C801 is reflected by the transformer coupling between L806 and L706 to be effectively in series with the portion of L706 furthest from ground G. The combination serves as a series trap circuit and is tuned to channel 12 providing about 20 dB attenuation at 210 MHz and about 10 dB at 205 MHz. A portion of operating voltage +V developed by the voltage divider including resistances R801 and R802 is applied to the anode of switch diode SD801. Bypass capacitance C802 couples the upper interconnection of C801 and L806 to ground at TV frequencies at which it exhibits a negligibly small impedance; capacitance C803 similarly couples the cathode of SD801 to ground.

For broadcast reception, switch S1B, which is a second pole of switch S1A described above in relation to FIG. 1, is in position BC-B to apply voltage +V to the cathode of SD801 via switch S2 and resistance R803 to reverse bias SD801. With SD801 reverse biased, C801 is coupled as described above. When any of channels 11, 12 or 13 is selected, S2 transfers from position IN to position $\overline{\text{IN}}$ to forward bias SD801 by grounding its cathode. As a result, C801 is coupled to ground through the negligibly small impedances of SD801, C803 and C802 essentially short circuiting C801 and thereby disabling the C801-L706 trap circuit just described.

For CATV reception, S1B is transferred to position CA-B to similarly disable the C801-L706 trap circuit.

What is claimed is:

1. A multiband tuning system for producing an IF signal from RF signals residing in, in the order named, a first broadcast band, a first cable band, a second broadcast band, a second cable band, and a third broadcast band comprising:
    control means for generating a tuning signal having a magnitude determined by the frequency of a selected channel;

first filter means for selecting RF signals corresponding to channels selected in a first tuning band including said first broadcast band and a lower frequency portion of a said first cable band in response to said tuning signal;

second filter means for selecting RF signals corresponding to channels selected in a second tuning band including a higher frequency portion of said first cable band, said second broadcast band and at least the lower frequency portion of said second cable band in response to said tuning signal;

filter selection means for enabling the operation of said first filter means when the selected channel is in said first tuning band and for enabling the operation of said second filter means when the selected channel is in said second tuning band wherein said filter selection means includes:

an input node at which the signals in said first and second tuning bands are received and an output node, first and second diode means respectively connecting respective input connections of said first and second filter means to said input node, third and fourth diode means respectively connecting respective output connections of said first and second filter means to said output node, and second control means for rendering said first and third diode means conductive when said selected channel is within said first tuning band and for rendering said second and fourth diode means conductive when said selected channel is within said second tuning band;

third filter means for selecting RF signals corresponding to channels selected in a third tuning band including said third broadcast band;

combining means for combining RF signals selected by the enabled one of said first and second filter means and RF signals selected by said third filter means;

local oscillator means for generating a local oscillator signal, the frequency of which is responsive to said tuning signal; and mixing means for translating the frequency of the combined RF signal from said combining means in response to said local oscillator signal to produce said IF signal.

2. The tuning system of claim 1 wherein said first tuning band includes RF signals at frequencies less than a predetermined partition frequency selected to be in the range between about 90 and 174 megaHertz, and wherein said second tuning band includes RF signals at frequencies greater than said partition frequency.

3. The tuning system of claim 2 wherein said partition frequency is selected to be about 150 megaHertz.

4. The tuning system of claim 1 wherein said control means maintains said first, second, third and fourth diode means nonconductive when said selected channel frequency is without said first and second tuning bands.

5. The tuning system of claim 1 including:

amplifying means interposed between said output node and said combining means, said amplifying means having an input connection to which said output node connects and having an output connection connected to said combining means; and means for applying an operating potential to said amplifying means when any of said first, second, third and fourth diode means are rendered conductive and for removing said operating potential when said first, second, third and fourth diode means are nonconductive.

6. The tuning system of claim 1 including:

amplifying means having an input connection to which said third filter means connects and having an output connection connected to said combining means;

and means for applying an operating potential to said amplifying means when said selected channel frequency is within said third tuning band and for removing said operating potential when said selected channel frequency is without said third tuning band.

7. The tuning system of claim 1 wherein said first filter means includes a double-tuned low-pass filter tunable by a first voltage-variable capacitance diode across which said tuning signal is applied, said low-pass filter being characterized in that it preferentially selects RF signals over a bandwidth including the frequency of the selected channel, which bandwidth is substantially greater when a relatively higher channel frequency is selected than when a relatively lower channel frequency is selected.

8. The tuning system of claim 1 wherein said second filter means includes a double-tuned high-pass filter tunable by a second voltage-variable capacitance diode across which said tuning signal is applied, said high-pass filter being characterized in that it preferentially selects RF signals over a bandwidth including the frequency of the selected channel, which bandwidth is substantially greater when a relatively higher channel frequency is selected than when a relatively lower channel frequency is selected.

9. The tuning system of claim 1 wherein said local oscillator means includes a plurality of tunable oscillators in like number to the number of said filter means, each of said tunable oscillators being tunable responsive to said tuning signal for making the frequency of the local oscillator signal track the frequency of the selected channel tuned by said filter means with which it is associated.

10. The tuning system of claim 1 further comprising:

second local oscillator means for generating a second local oscillator signal at a predetermined frequency;

second mixing means for translating the frequency of said IF signal in response to said second local oscillator signal to develop a second IF signal at a second IF frequency less than that of said IF signal.

11. The tuning system of claim 10 wherein said first, second and third tuning bands include only RF signals at frequencies greater than that of said second IF frequency.

12. The tuning system of claim 11 wherein said second IF frequency is about 46 megaHertz.

13. The tuning system of claim 1 wherein said third tuning band includes only RF signals at frequencies greater than about 470 megaHertz, said first and second tuning bands include only RF signal frequencies lesser than about 402 megaHertz, and said IF signal is at an IF frequency selected to be between about 402 and 470 megaHertz.

14. The tuning system of claim 13 wherein said IF frequency is about 416 megaHertz.

15. A multiband tuning system for producing an IF signal from RF signals residing in, in the order named, a first broadcast band, a first cable band, a second broadcast band, and a second cable band, comprising:

control means for generating a tuning signal having a magnitude determined by the frequency of a selected channel;

first filter means responsive to said tuning signal for selecting RF signals corresponding to channels selected in a first tuning band including said first broadcast band and a lower frequency portion of a said first cable band, wherein said first filter means exhibits a peaked response tunable over said first tuning band by a first voltage-variable capacitance device across which said tuning signal is applied, said peaked response to preferentially select ones of said RF signals over a relatively narrow bandwidth including the frequency of the selected channel, which bandwidth is substantially greater when a relatively higher channel frequency in said first tuning band is selected than when a relatively lower channel frequency therein is selected;

second filter means responsive to said tuning signal for selecting RF signals corresponding to channels selected in a second tuning band including a higher frequency portion of said first cable band, said second broadcast band and at least a lower frequency portion of said second cable band, wherein said second filter means exhibits a peaked response tunable over said second tuning band by a second voltage-variable capacitance device across which said tuning signal is applied, said peaked response to preferentially select ones of said RF signals over a relatively narrow bandwidth including the frequency of the selected channel, which bandwidth is substantially greater when a relatively higher channel frequency in said second tuning band is selected than when a relatively lower channel frequency therein is selected;

filter selection means for enabling the operation of said first filter means when the selected channel is in said first tuning band and for enabling the operation of said second filter means when the selected channel is in said second tuning band; and frequency translating means to which said first and second filter means are coupled for producing said IF signal from said RF signals corresponding to said selected channel.

16. The tuning system of claim 15 wherein said second filter means includes a resonant trap circuit for attenuating signals at frequencies at about an integral submultiple of that of said IF signal, and means for disabling said trap circuit when said selected channel is at a frequency near said integral submultiple of that of said IF signal.

17. The tuning system of claim 15 wherein said first tuning band includes RF signals at frequencies less than a predetermined partition frequency selected to be in said first cable band in the range between about 90 and 174 megaHertz, and wherein said second tuning band includes RF signals at frequencies greater than said partition frequency.

18. The tuning system of claim 17 wherein said partition frequency is selected to be about 150 megaHertz.

* * * * *